(12) United States Patent
Khiledaar et al.

(10) Patent No.: US 10,151,780 B2
(45) Date of Patent: Dec. 11, 2018

(54) METHOD AND TESTING APPARATUS FOR ON-SITE MONITORING OF PERFORMANCE OF ENERGY DEVICES

(71) Applicant: CARRIER CORPORATION, Jupiter, FL (US)

(72) Inventors: Nithin Khiledaar, Bangalore (IN); Rajesh Thiruvenkatam, Bangalore (IN); Niladri Das Mahapatra, Bangalore (IN); Arun Chaitanya Mandala, Bangalore (IN)

(73) Assignee: CARRIER CORPORATION, Jupiter, FL (US)

( * ) Notice: Subject to any disclaimer, the term of this patent is extended or adjusted under 35 U.S.C. 154(b) by 562 days.

(21) Appl. No.: 14/742,934

(22) Filed: Jun. 18, 2015

(65) Prior Publication Data

US 2016/0258989 A1   Sep. 8, 2016

(30) Foreign Application Priority Data

Mar. 4, 2015   (IN) ............................ 1040/CHE/2015

(51) Int. Cl.
　　*G01R 31/30*　　(2006.01)
　　*G01R 21/133*　　(2006.01)
　　*G01R 31/28*　　(2006.01)

(52) U.S. Cl.
　　CPC .......... *G01R 21/133* (2013.01); *G01R 31/282* (2013.01)

(58) Field of Classification Search
　　CPC .................................................... G01R 31/282
　　USPC .......................................................... 702/58
　　See application file for complete search history.

(56) References Cited

U.S. PATENT DOCUMENTS

| 5,481,481 | A | * | 1/1996 | Frey | ................... | G05B 19/0421 |
| | | | | | | 340/3.1 |
| 2012/0095605 | A1 | * | 4/2012 | Tran | ........................ | B05D 5/00 |
| | | | | | | 700/285 |
| 2014/0330533 | A1 | * | 11/2014 | Gadlage | ........... | G01R 31/31907 |
| | | | | | | 702/120 |
| 2015/0286226 | A1 | * | 10/2015 | Fadell | .................... | G06Q 10/20 |
| | | | | | | 700/276 |

\* cited by examiner

*Primary Examiner* — Hoai V Ho
(74) *Attorney, Agent, or Firm* — Cantor Colburn LLP

(57) ABSTRACT

Embodiments of the present disclosure disclose a method for on-site monitoring of performance of energy devices. The method comprises measuring a value associated with one or more energy parameters of one or more energy devices in real time. The method further comprises comparing the measured value of the one or more energy devices with a predefined set of tolerance values corresponding to the one or more energy parameters of the one or more energy devices. The method further comprises indicating a result of the comparison on a display unit associated with the testing apparatus for on-site monitoring performance of the one or more energy devices.

11 Claims, 4 Drawing Sheets

METHOD AND TESTING APPARATUS FOR ON-SITE MONITORING OF PERFORMANCE OF ENERGY DEVICES

This application claims the benefit of Indian Patent Application Serial No. 1040/CHE/2015 filed Mar. 4, 2015, which is hereby incorporated by reference in its entirety.

FIELD

The present subject matter is related, in general to on-site testing of devices and more particularly, but not exclusively to a method and a testing apparatus for on-site monitoring performance of energy devices.

BACKGROUND

In general, devices are installed in the one or more sites. The one or more sites includes entities, without limitation, medical centers, food centers like restaurants, dormitories, residencies, diagnostic centers, workplaces, factories, industries, and the like. The devices installed in the one or more sites may include, without limitations, power meters, temperature sensors, fuel sensors, televisions, Air Conditioners (AC), fans, generators, inverters, refrigerators, cooling devices, heating devices, washing machines, blenders, household devices, domestic devices, factory machines, medical and diagnostic devices etc. Each device is associated with one or more energy parameters which include, without limitations, power, voltage, current, temperature, apparent energy, power factor, run hours active energy etc. Usually, there is a necessity to regularly verify or perform validation of functioning or performance of each device in order to ensure effective functioning of the devices.

In conventional approach, the devices are verified or validated on site by a manual process where at least two persons are required to monitor the performance of each device. The two persons may include a field person and a support person. Specifically, the two persons have to go to the one or more sites and verify the performance of each device. For verification, values associated to the one or more energy parameters of the corresponding device are measured and uploaded in to a server manually. The server is related to validate the performance of the devices which is not a real-time process. Thus, the validation or verification performed by the manual process is tedious and time consuming. Additionally, such a conventional approach increases complexity and human errors in measuring the performance of the devices during the installation and/or the retrofit activities. Additionally, the instant monitoring of the performance of the devices involves a great complexity and challenge in the conventional approach.

Further, in the conventional approach, multiple visits to the sites are required from the two persons when the devices are not validated in real-time i.e. at the time of installation and/or during retrofit activities of the devices.

Furthermore, in the conventional approach, identifying incorrect mapping/connection of devices to respective power switches is difficult. In such a case, the devices can consume huge load and thus minimization of power consumption by the devices is a great challenge. Also, testing and the verification of the mapping of the device to the respective power switches during the installation and/or the retrofit activities is a tedious effort and time consuming process.

SUMMARY

Disclosed herein is a method for on-site monitoring of performance of energy devices. The method comprises measuring a value associated with one or more energy parameters of one or more energy devices in real time. The method further comprises comparing the measured value of the one or more energy devices with a predefined set of tolerance values corresponding to the one or more energy parameters of the one or more energy devices. The method further comprises indicating a result of the comparison on a display unit associated with the testing apparatus for on-site monitoring performance of the one or more energy devices.

In an aspect of the present disclosure, a testing apparatus for on-site monitoring of performance of energy devices is disclosed. The testing apparatus comprises a processor and a memory communicatively coupled to the processor. The memory stores processor-executable instructions, which, on execution, cause the processor to measure a value associated with one or more energy parameters of one or more energy devices in real time. The processor is configured to compare the measured value of the one or more energy devices with a predefined set of tolerance values corresponding to the one or more energy parameters of the one or more energy devices. The processor is configured to indicate a result of the comparison on a display unit associated with the testing apparatus for on-site monitoring performance of the one or more energy devices.

In another aspect of the present disclosure, a non-transitory computer readable medium for on-site monitoring of performance of energy devices is disclosed. The non-transitory computer readable medium includes instructions stored thereon that when processed by a processor causes the system to perform operations comprising measuring a value associated with one or more energy parameters of one or more energy devices in real time. The measured value of the one or more energy devices is compared with a predefined set of tolerance values corresponding to the one or more energy parameters of the one or more energy devices. A result of the comparison is indicated on a display unit associated with the testing apparatus for on-site monitoring performance of the one or more energy devices.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The accompanying drawings, which are incorporated in and constitute a part of this disclosure, illustrate exemplary embodiments and, together with the description, serve to explain the disclosed principles. In the figures, the left-most digit(s) of a reference number identifies the figure in which the reference number first appears. The same numbers are used throughout the figures to reference like features and components. Some embodiments of system and/or methods in accordance with embodiments of the present subject matter are now described, by way of example only, and with reference to the accompanying figures, in which.

Figure 1:
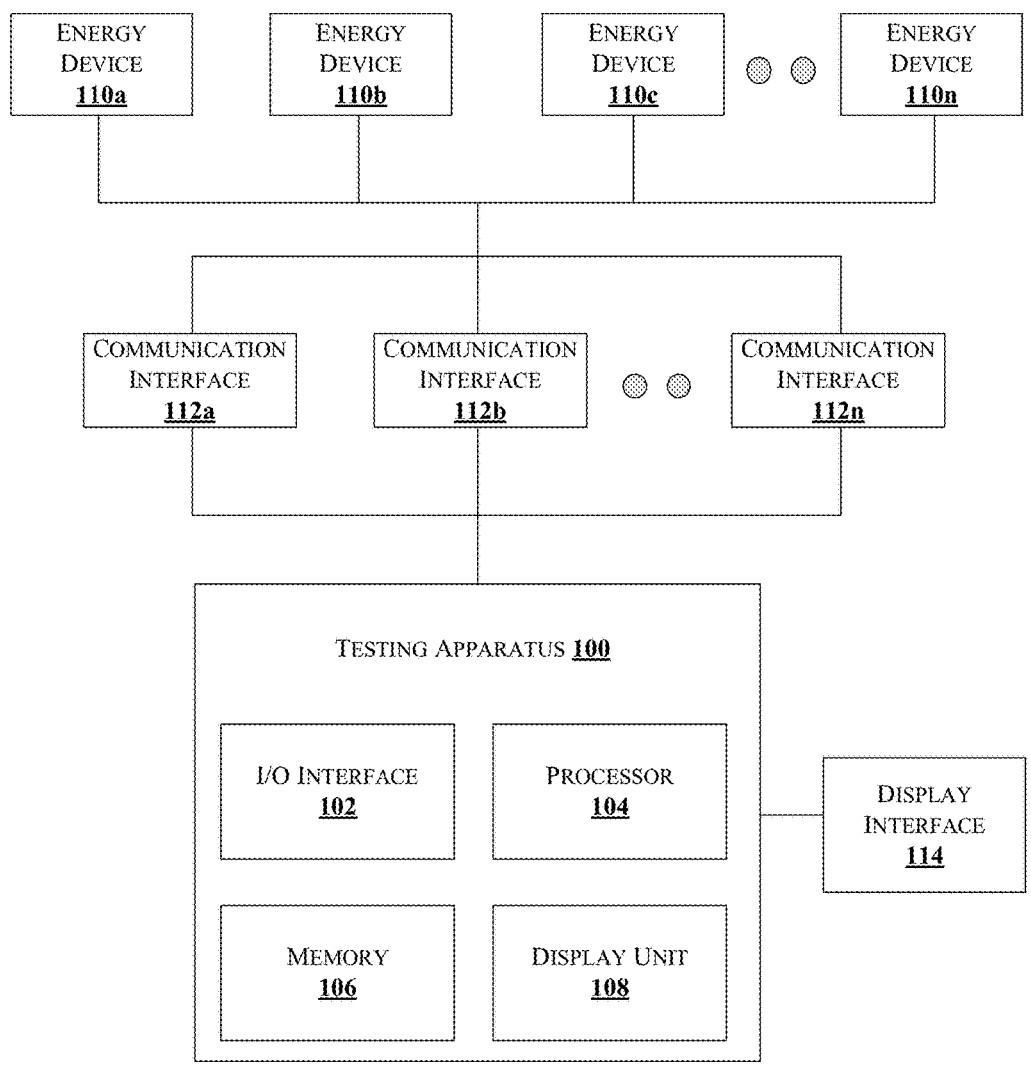
FIG. 1 illustrates a block diagram of an exemplary testing apparatus with processor and memory connected to one or more energy devices through one or more communication interfaces in accordance with some embodiments of the present disclosure.

It should be appreciated by those skilled in the art that any block diagrams herein represent conceptual views of illustrative systems embodying the principles of the present subject matter. Similarly, it will be appreciated that any flow charts, flow diagrams, state transition diagrams, pseudo code, and the like represent various processes which may be substantially represented in computer readable medium and executed by a computer or processor, whether or not such computer or processor is explicitly shown.

DETAILED DESCRIPTION

In the present document, the word "exemplary" is used herein to mean "serving as an example, instance, or illustration." Any embodiment or implementation of the present subject matter described herein as "exemplary" is not necessarily to be construed as preferred or advantageous over other embodiments.

While the disclosure is susceptible to various modifications and alternative forms, specific embodiment thereof has been shown by way of example in the drawings and will be described in detail below. It should be understood, however that it is not intended to limit the disclosure to the particular forms disclosed, but on the contrary, the disclosure is to cover all modifications, equivalents, and alternative falling within the spirit and the scope of the disclosure.

The terms "comprises", "comprising", or any other variations thereof, are intended to cover a non-exclusive inclusion, such that a setup, device or method that comprises a list of components or steps does not include only those components or steps but may include other components or steps not expressly listed or inherent to such setup or device or method. In other words, one or more elements in a system or apparatus proceeded by "comprises . . . a" does not, without more constraints, preclude the existence of other elements or additional elements in the system or apparatus.

Embodiments of the present disclosure are related to a method and a testing apparatus for on-site monitoring of performance of energy devices. Particularly, the present disclosure provides on-site validation of performance of the energy devices in real time. The present disclosure provides instant and on-site monitoring of performance of the energy devices i.e. during installation and/or retrofit activities of the energy devices. The embodiments use the testing apparatus which is a portable device that is connected to the energy devices through communication interfaces for example Recommend Standard 485 (RS485). The testing apparatus being the portable device is capable for on-site monitoring of the performance of the energy devices in real-time and dynamically. The energy devices include, without limitations, sensors, meters, and electrical appliances. Each energy device is associated with energy parameters including, without limitations, power, voltage, current, temperature, resistance, load, capacitance, inductance, impedance, tolerances, active energy etc. In real time i.e. during the on-site installation and/or retrofit activities of the energy device, a value associated with energy parameter of the energy device is measured. The measured value is compared with predefined tolerance values of the corresponding energy device. The result of the comparison is indicated on a display unit associated with the testing apparatus. The indication of the comparison has a technical advantage over the conventional approaches. Particularly, the conventional approach fails to indicate an error in performance of the energy devices. Further, the present disclosure relates to detecting connection of the energy devices with respective power switches. Upon detection, the connection of the energy devices with the respective switches is swapped based on the result of the comparison and error in performance of the energy devices. In such a way, the energy parameters consumed by the energy devices is detected. Also, measures to be taken to minimize the consumption of the energy parameters are determined. Additionally, the embodiments of the present disclosure provide recommendation for rectifying the performance of the energy devices which is a technical advancement over the conventional approach.

In the following detailed description of the embodiments of the disclosure, reference is made to the accompanying drawings that form a part hereof, and in which are shown by way of illustration specific embodiments in which the disclosure may be practiced. These embodiments are described in sufficient detail to enable those skilled in the art to practice the disclosure, and it is to be understood that other embodiments may be utilized and that changes may be made without departing from the scope of the present disclosure. The following description is, therefore, not to be taken in a limiting sense.

FIG. 1 illustrates a block diagram of an exemplary testing apparatus 100 with processor 104 and memory 106 connected to one or more energy devices 110a, 110b, 110c, . . . , 110n (collectively referred to 110) through one or more communication interfaces 112a, 112b, . . . , 112n (collectively referred to 112) in accordance with some embodiments of the present disclosure.

In an embodiment, the testing apparatus 100 is a portable apparatus i.e. a hand held apparatus. The testing apparatus 100 is capable of monitoring performance of the one or more energy devices 110 during site installation and/or retrofit activities of the one or more energy devices 110. The testing apparatus 100 is configured to act as an emulator i.e. a hardware emulator. Examples of the testing apparatus 100 include, but are not limited to, mobiles phones, laptop, tablet, notebook, Personal Digital Assistant (PDA), cellular devices, and the like. In computers, the emulator is a hardware device, and/or software embedded in the hardware device and/or a firmware which is capable of controlling and/or monitoring the performance of the one or more energy devices 110.

Examples of the one or more energy devices 110 include, but are not limited to, energy meters, temperature sensors, fuel sensors, televisions, Air Conditioners (AC), electric fans, generators, inverters, refrigerators, cooling devices, heating devices, washing machines, blenders, household devices, domestic devices, factory machines, medical and diagnostic devices etc. In an embodiment, each energy device comprises a device Identification (ID). Each energy device is associated with one or more energy parameters which includes, without limitations, power, voltage, current, temperature, apparent energy, power factor, run hours, active energy etc. For example, AC is associated with the one or more energy parameters like temperature, power and load etc. The energy meters may be associated with the one or more energy parameters like voltage, the current, apparent energy, power factor, run hours etc. A person skilled in art should understand that each energy device may be associated with such energy parameters which are traditionally applicable to the corresponding energy device. In one implementation, the one or more energy devices 110 can be installed in one or more sites. The one or more sites include, but are not limited to, medical centers, food centers like restaurants, dormitories, residencies, diagnostic centers, workplaces, factories, industries, and the like. For example, consider the site as restaurant. The restaurant may be installed with the one or more energy devices 110 such as television, AC, one or more energy meters, one or more fuel sensors such as generators, one or more temperature sensors, electric heaters, refrigerators etc. Each of the one or more energy devices 110 is connected to the testing apparatus 100 through the one or more communication interfaces 112. The one or more communication interface 112 can be, without limitation, Recommend Standard 485 (RS485). In one implementation, the one or more energy devices 110 are connected to the testing apparatus 100 using a Field Input Output Digital (FIOD) device (226 in FIG. 2) and/or a Field Input Output Analog (FIOA) device (228 in FIG. 2). For example, the one or more energy devices 110 such as, without limitation, television, electric heater, AC and refrigerator are connectable to the testing apparatus 100 using the FIOD device (226) through which digital output can be received by the testing apparatus 100. The one or more temperature sensors are connectable to the testing apparatus 100 using the FIOA device (228) through which analog inputs can be received by the testing apparatus 100. In an embodiment, the one or more energy devices 110 are connected to a respective power switch configured in the one or more sites. Particularly, the one or more energy devices 110 which may be controlled through commands using the FIOD device by the testing apparatus 100 are connected to the respective power switch. For example, television may be connected to power switch A, the refrigerator may be connected to power switch B etc. In an embodiment, a process involving validation and/or monitoring performance of the one or more energy devices 110 in real time in the one or more sites by the testing apparatus 100 is referred as on-site monitoring.

The testing apparatus 100 may include input/output (I/O) interface 102, at least one central processing unit ("CPU" or "processor") 104, a memory 106 and a display unit 108.

The I/O interface 102 is configured to receive one or more values associated to the one or more energy parameters corresponding to the one or more energy devices 110 in real-time and dynamically. The I/O interface 102 transmits the commands to the one or more energy devices 110 through the FIOD device (226) for detecting the switch ON/OFF mode of the one or more energy devices 110. The I/O interface 102 receives inputs associated to the connection of the one or more energy devices 110 with the respective power switch. Additionally, the I/O interface 102 is configured to transmit a swap operation command to the respective power switch for swapping the connection of the respective power switch between the one or more energy devices 110. In one embodiment, the I/O interface 102 indicates a result of comparison of the one or more received values with a predefined set of tolerance values corresponding to the one or more energy parameters of the one or more energy devices 110. In such a way, the I/O interface 102 indicates a result of the on-site monitoring of the performance of the one or more energy devices 110 in real-time. In an embodiment, the I/O interface 102 indicates error in the performance of the one or more energy devices 110. Further, the I/O interface 102 indicates the detection of the connection of the respective power switch with the one or more energy devices 110 based on the result of the comparison and error in the performance. Furthermore, an alert based on the result of the comparison, the error in the performance and error in the connection of the power switch with the respective one or more energy devices 110 are provided through the I/O interface 102 for user notification. Additionally, a recommendation for rectifying the one or more energy devices 110 and the connection of the power switch with the respective one or more energy devices 110 are provided through the I/O interface 102 for user view and notification. In an embodiment, the user may include a person, a person using the testing apparatus 100 such as those included in this disclosure. In one implementation, the result of the comparison, the indication of the error in the performance of the one or more energy devices 110, and the connection of the power switches with the one or more energy devices 110 are provided to the display unit 108 configured in the testing apparatus 100 itself and/or a display interface 114. Also, the alert and the recommendation are provided to the display unit 108 configured in the testing apparatus 100 itself and/or the display interface 114. In an embodiment, the display interface 114 is communicatively connected to the testing apparatus 100 through a communication network (not shown in FIG. 1). In an embodiment, the I/O interface 102 is coupled with the processor 104.

The processor 104 may comprise at least one data processor for executing program components for executing user- or apparatus-generated energy parameters. In one example, the processor 104 is a microcontroller capable for on-site monitoring of the performance of the one or more energy devices 110. The processor 104 initiates the on-site monitoring of the performance of the one or more energy devices 110 upon receiving the one or more values through the I/O interface 102. The processor 104 measures the one or more values associated to the one or more energy parameters corresponding to the one or more energy devices 110 in real-time. The processor 104 is further configured to compare the measured one or more values with the predefined set of tolerance values of the corresponding energy parameters pertaining to the one or more energy devices 110. The processor 104 indicates the result of the comparison through the I/O interface 102 on the display unit 108 and/or the display interface 114 for user notification. Further, the processor 104 determines the error in the performance of the one or more energy devices 110. The processor 104 is further configured to detect the connection of the one or more energy devices 110 with the respective power switch. Upon detection, the processor 104 determines the error in the connection based on the result of the comparison and the error in the performance. Then, the processor 104 swaps the connection of the respective power switch between the corresponding one or more energy devices 110. The processor 104 generates the alert based on the result of the comparison, the error in the performance of the one or more energy devices 110 and error in the connection of the one or more energy devices 110 with the respective power switch. The processor 104 generates the recommendation for rectifying the one or more energy devices 110 and the connection of the one or more energy devices 110 with the respective power switch. The processor 104 is configured to provide the indication of the error in the performance of the one or more energy devices 110, the alert and the recommendation to the display unit 108 and/or the display interface 114 for user view and notification. In an embodiment, the processor 104 executes one or more modules described in following description of the disclosure. The one or more modules perform the on-site monitoring of the performance of the one or more energy devices 110.

The memory 106 stores instructions which are executable by the at least one processor 104. The memory 106 stores the one or more energy parameters to which the corresponding one or more energy devices 110 are associated. The memory 106 stores the predefined set of tolerance values of the one or more energy parameters corresponding to the one or more energy devices 110. Additionally, the memory 106 stores control information along with information of the respective power switch of the one or more energy devices 110. For example, the ON/OFF mode of the one or more energy devices 110 controllable by testing apparatus 100 using commands are stored in the memory 106. Additionally, for example, information relating to the switch A configured for the television and switch B configured for the refrigerator is stored in the memory 106. In an embodiment, the one or more energy parameters, the predefined set of tolerance values, the control information along with the commands and the information of the power switch are stored as one or more data. The one or more data are used for on-site monitoring of the performance of the one or more energy devices 110 which are described in detail in the following description of the disclosure.

Figure 2:
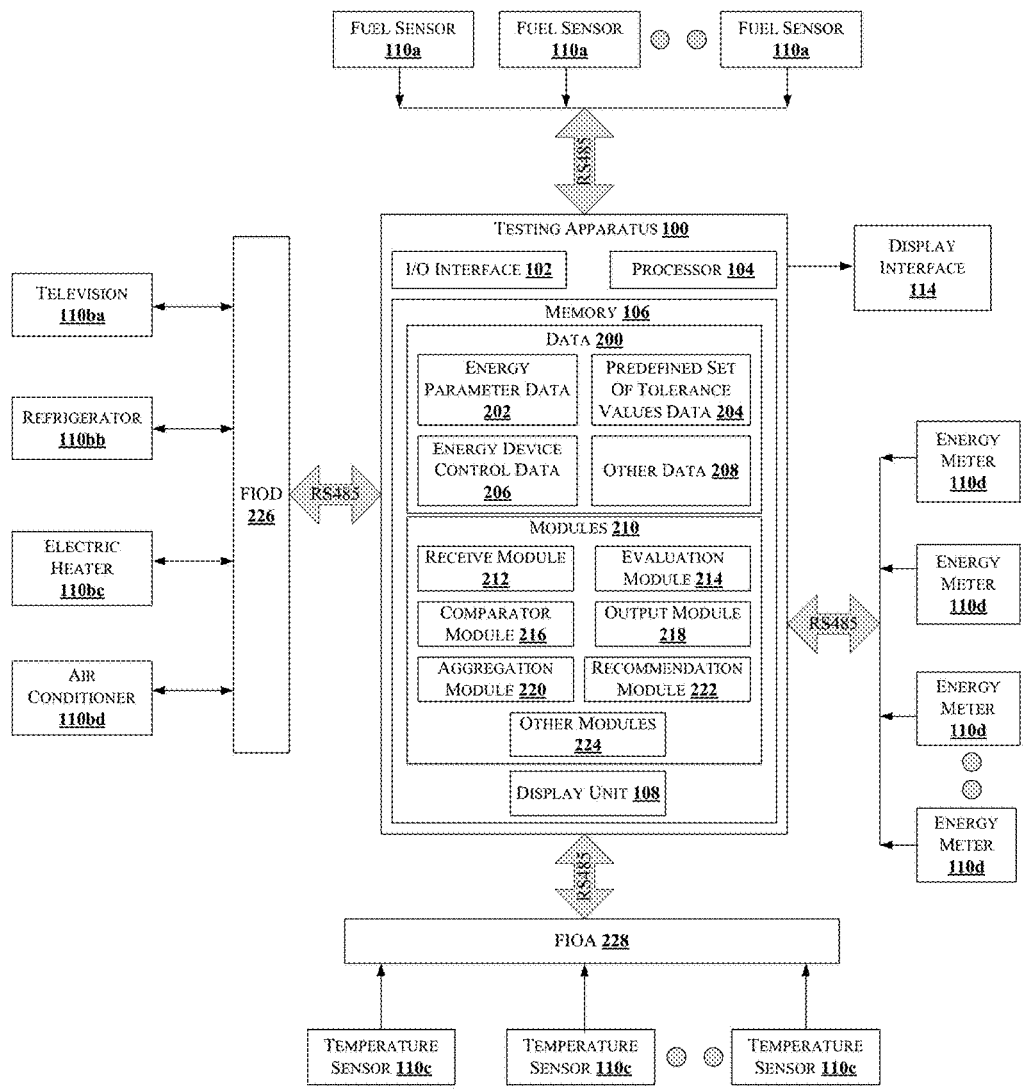
FIG. 2 illustrates a block diagram of an exemplary testing apparatus with various modules for on-site monitoring of performance of one or more energy devices in accordance with some embodiments of the present disclosure.

FIG. 2 illustrates a block diagram of the exemplary testing apparatus 100 with the one or more data 200 and the one or more modules 210 for on-site monitoring of performance of the one or more energy devices 110 in accordance with some embodiments of the present disclosure. In the illustrated FIG. 2, the one or more data 200 and the one or more modules 210 are stored in the memory 106.

In one exemplary embodiment FIG. 2 illustrates a scenario of a site, for example a restaurant, installed with the one or more energy devices 110. Considering, the site i.e. the restaurant is installed with the one or more energy devices 110. The one or more energy devices 110 in this scenario comprises one or more fuel sensors 110$a$, a television 110$ba$, refrigerator 110$bb$, electric heater 110$bc$, AC 110$bd$, one or more temperature sensors 110$c$ and one or more energy meters 110$d$. In the illustrated FIG. 2, the one or more fuel sensors 110$a$ and the one or more energy meters 110$d$ are connected to the testing apparatus 100 using the RS485 as the one or more communication interfaces 112. The television 110$ba$, the refrigerator 110$bb$, the electric heater 110$bc$ and the AC 110$bd$ are connected to the testing apparatus 100 using the FIOD device 226 through the RS485 as the one or more communication interface 112. The one or more temperature sensors 110$c$ are connected to the testing apparatus 100 using the FIOA device 228 through the RS485 as the one or more communication interface 112. The one or more energy devices 110 can be installed in different sections/areas of the one or more sites. Assuming, the restaurant has different sections/areas in which the one or more energy devices 110 are installed. The one or more temperature sensors 110$c$ can also be installed in different sections/areas. For example, the one or more temperature sensors 110$c$ can be installed in a cold room, a freezer room, dining area and kitchen etc. Further, the one or more energy devices 110 are used to provide load to other energy devices among the one or more energy devices 110. For example, the one or more fuel sensors 110$a$ can be used to operate the electric heater 110$bc$ and/or the AC 110$bd$. In an embodiment, the one or more energy meters 110$d$ can provide different power supply to different sections/areas of the restaurant. Furthermore, the one or more energy devices 110 comprising the television 110$ba$, the refrigerator 110$bb$, the electric heater 110$bc$ and the AC 110$bd$ are connected to the respective power switch configured in the different sections/areas of the restaurant. For example, the television 110$ba$ may be connected to the power switch A and the refrigerator 110$bb$ may be connected to the power switch B and so on. Each of the one or more energy devices 110 are associated with the one or more data 200 which are stored in the memory 106 of the testing apparatus 100. The testing apparatus 100 performs on-site monitoring of the performance of the one or more energy devices 110 using the one or more data 200 predefined corresponding for each of the one or more energy devices 110.

In an embodiment, the one or more data 200 may include, for example, energy parameter data 202, predefined set of tolerance values data 204, energy device control data 206 and other data 208 associated with each of the one or more energy devices 110 for usage in on-site monitoring of the performance of the one or more energy devices 110 in real time.

The energy parameter data 202 refers to the one or more energy parameters associated with the corresponding one or more energy devices 110. For example, the television 110$ba$ may be associated with energy parameters such as current and power. The one or more fuel sensor 110$a$ may be associated with energy parameters such as load, voltage, power, impedance inductance etc. The one or more temperature sensors 110$c$ may be associated with energy parameters such as load, power, and temperature. The one or more energy meters 110$d$ may be associated with energy parameters such as the current (I). The one or more energy parameters corresponding to the one or more energy devices 110 are stored in the memory 106 as the energy parameter data 202.

The predefined set of tolerance values data 204 refers to a set of tolerance values predefined for each of the one or more energy devices 110 independently. For example, the television 110$ba$ may be predefined with set of tolerance of current values having minimum value as 1 Ampere (A) and maximum as 5 A and voltage with minimum value as 10 Volts (V) and maximum value as 50V. The one or more fuel sensors 110$a$ may be predefined with set of tolerance values associated with the voltage having minimum voltage value of 10V and maximum voltage value of 100V. In an embodiment, the one or more fuel sensors 110$a$ can be predefined with different set of tolerance values independent of one another. The one or more temperature sensors 110$c$ may be predefined with set of tolerance values associated with the temperature having minimum temperature value of −500 Celcius (C) and maximum temperature of 500 C. In an embodiment, the one or more temperature sensors 110$c$ in the different sections/areas can be predefined with different set of tolerance values. For example, the cold room may be predefined with minimum temperature value of 00 C and maximum temperature value of 30 C. Likewise, the freezer room may be set with minimum temperature value of −150 C and maximum temperature value of −180 C, the dining area may be set with minimum temperature value of 230 C and maximum temperature value of 260 C and kitchen may be set with minimum temperature value of 260 C and maximum temperature value of 300 C. The one or more energy meters 110$d$ may be predefined with set of tolerance values associated with the current (I) having minimum current value of 1 A and maximum current value of 100 A. In an embodiment, the one or more energy meters 110$d$ can be predefined with different set of tolerance values independent of one another. In an embodiment, the predefined set of tolerance values data 204 refers to a tolerance value predefined for the one or more energy devices 110. For example, assuming the voltage tolerance value predefined for the television 110$ba$ is 10V.

The energy device control data 206 refers to the control information pertained to the one or more energy devices 110 which can be controlled through commands by the testing apparatus 100. Particularly, energy device control data 206 refers to the control information where the switch ON/OFF mode of the one or more energy devices 110 can be controlled through the commands. For example, consider the switch ON mode of the television 110*ba* can be controlled using the command "0011" and the switch OFF mode of the television 110*ba* can be controlled using the command "1100". The commands "0011" and "1100" is stored as the energy device control data 206. The energy device control data 206 also include the information relating to the power switch to which the one or more energy devices are connected. For example, consider the television 110*ba* is predefined to be connected to the power switch A through which the switch ON/OFF mode of the television 110*ba* is controlled using the corresponding commands. The refrigerator 110*bb* is predefined to be connected to the power switch B through which the switch ON/OFF mode of the refrigerator 110*bb* is controlled using the corresponding commands.

The other data 208 may refer to such data which can be predefined in the testing apparatus 100 for on-site monitoring the performance of the one or more energy devices 110.

In an embodiment, the one or more data 200 in the memory 106 are processed by the one or more modules 210 of the testing apparatus 100. The one or more modules 210 may be stored within the memory 106 as shown in FIG. 2. In an example, the one or more modules 210, communicatively coupled to the processor 104, may also be present outside the memory 106. As used herein, the term module refers to an application specific integrated circuit (ASIC), an electronic circuit, a processor (shared, dedicated, or group) and memory that execute one or more software or firmware programs, a combinational logic circuit, and/or other suitable components that provide the described functionality.

In one implementation, the one or more modules 210 may include, for example, a receive module 212, an evaluation module 214, a comparator module 216, an output module 218, an aggregation module 220 and a recommendation module 222. The processor 104 may also comprise other modules 224 to perform various miscellaneous functionalities of the testing apparatus 100. It will be appreciated that such aforementioned modules may be represented as a single module or a combination of different modules.

The receive module 212 is configured to receive a value associated with the one or more energy parameters corresponding to the one or more energy devices 110 through the RS485 communication interface 112. For example, a value of the energy parameter voltage associated with the one or more fuel sensors 110*a* is received by the receive module 212. A temperature value of the energy parameter temperature associated with the one or more temperature sensors 110*c* is received as analog inputs by the receive module 212. A current value of the energy parameter current (I) associated with the one or more energy meters 110*d* is received by the receive module 212. In case of the one or more energy devices 110 such as television 110*ba*, the refrigerator 110*bb* and so on, the current and the voltage values associated are received by the receive module 212.

The evaluation module 214 is configured to measure the values associated with the one or more energy parameters received by the receive module 212. For example, consider the voltage value received from the one or more fuel sensors 110*a* is 110V which is evaluated or measured by the evaluation module 214. Likewise, the temperature value received from the one or more temperature sensors 110*c* for the freezer room is measured to be −120 C. The current value of the one or more energy meters 110*d* is measured to be 110 A. The voltage value of the television 110*ba* is measured to be 9V.

The comparator module 216 is configured to compare the measured value of the one or more energy devices 110 with the predefined set of tolerance values corresponding to the one or more energy parameters of the one or more energy devices 110. For example, the voltage value of the one or more fuel sensors 110*a* is compared with set of tolerance voltage values of 10V and 100V predefined for the one or more fuel sensors 110*a*. The temperature value of the one or more temperature sensors 110*c* of the freezer room is compared with set of tolerance temperature values of −150 C and −180 C predefined for the freezer room. The current value of the one or more energy meters 110*d* is compared with set of tolerance current values of 1 A and 100 A. The voltage value of the television 110*ba* is compared with the set of tolerance voltage values of 10V and 50V predefined for the television 110*ba*. The result of the comparison is indicated on the display unit 108 and/or the display interface 114 for on-site monitoring the performance of the one or more energy devices 110. Particularly, when the measured value is out-of-bound of the predefined set of tolerance values, then the indication of the out-of-bound is indicated. For example, the voltage value of the one or more fuel sensors 110*a* is measured to be 110V. The voltage value being 100V is compared to be out-of-bound or not matching with the predefined set of tolerance values of the one or more fuel sensors 110*a* having 10V and 100V. Such out-of-bound state of the voltage value of the one or more fuel sensors 110*a* is indicated after comparison. The temperature value of the one or more temperature sensors 110*c* from the freezer room is measured to be −120 C. The temperature value of the one or more temperature sensors 110*c* of −120 C is out-of-bound of the predefined set of tolerance values of −150 C to −180 C. Thus, the out-of-bound state of the one or more temperature sensors 110*c* is indicated. The current value of the one or more energy meters 110*d* is measured to be 110 A which is out-of-bound of the predefined set of tolerance values of the one or more energy meters 110*d* having 1 A and 100 A. Thus, the out-of-bound state of the current value of the one or more energy meters 110*d* is indicated. The voltage value of the television 110*ba* is measured to be 9V which is out-of-bound of the predefined tolerance values of the television 110*ba* having 10V and 50V. This out-of-bound state of the voltage value of the television is indicated.

The output module 218 is configured to indicate the result of comparison being out-of-bound on the display unit 108 and/or the display interface 114. In an embodiment, the output module 218 generates the alert in relation to the result of comparison being out-of-bound of the predefined set of tolerance values on the display unit 108 and/or the display interface 114.

The aggregation module 220 is configured to aggregate one or more values associated with the one or more energy parameters of the one or more energy devices 110 in real-time. In an embodiment, the aggregation is performed based on factors which include, but are not limited to, predefined time intervals, predefined time period and number of the one or more values to be aggregated. The predefined time interval refers to intervals between which the one or more values are aggregated. For example, at intervals of every 1 minute, the one or more values are aggregated. The predefined time period refers to a duration for which the one or more values are aggregated. For example, for 5 minutes, the one or more values are aggregated. The number of the one or more values refers to number of values to be aggregated. For example, five values can be aggregated. Then, the comparator module 216 compares the aggregated one or more values with the predefined tolerance value corresponding to the one or more energy parameters of the one or more energy devices 110. Upon comparing, error in the performance of the one or more energy devices 110 is determined. For example, consider the television 110ba, who's the one or more power values are evaluated by the comparator module 216. Assuming, power values having 3 Watt (W), 4 W and 2 W pertains to the television 110ba measured in the real-time for every minute. The power values are aggregated for an hour which becomes 9 W. Now the aggregated power value is compared with the predefined tolerance value i.e. 10 W that is predefined for the television 110ba. When the aggregated value is not equal to the predefined tolerance value of the one or more energy devices 110, an unequal result of the aggregated value and the predefined tolerance value is indicated by the output module 218 on the display unit 108 and/or the display interface 114. In an embodiment, the alert on the unequal result is generated by the output module 218 on the display unit 108 and/or the display interface 114.

The one or more modules 210 also comprise a detection module (not shown in FIG. 2) which is configured to detect the connection of the one or more energy devices 110 to the one or more power switches. In an embodiment, the connection of the one or more energy devices 110 with the respective power switches is detected based on the result of the comparison and/or the error in performance of the one or more energy devices 110. In one implementation, the connection with the one or more power switches is detected upon detecting the switch ON/OFF mode of the one or more energy devices 110 using the commands. For example, considering the television 110ba whose connection with the respective power switch is required to be detected. For detecting the connection, the detection module transmits the command "1100" to detect the OFF mode of the television 110ba. The command "1100" is decoded by the FIOD device 226 and switches the television 110ba in OFF mode. Assuming, the television 110ba is not switched OFF from the command. Then, the detection module detects the power switch to which the television is connected. Assuming, the television 110ba is required to be connected to power switch A. But, upon detection, television 110ba is detected to be connected to power switch B. In such case, assuming, the television 110ba is consuming more voltage value than the predefined set of tolerance value of the television 110ba which should be minimum 10V and maximum of 50V. In order to minimize the energy parameter consumption by the one or more energy devices 110, the detection module swaps the connection between the one or more energy devices 110 to the corresponding one or more power switches. Thus, the connection of the television 110ba is swapped from power switch B to power switch A. In an embodiment, the alert is generated in relation to error in connection of the one or more energy devices 110 with the corresponding one or more power switches.

The recommendation module 222 is configured to recommend one or more steps for rectifying the one or more energy devices 110 for on-site monitoring of the one or more energy devices 110. For example, upon identifying the out-of-bound of temperature value of the one or more temperature sensors 110c, the recommendation module 222 may generate one or more recommendations. The one or more recommendations like "check the device ID of the one or more temperature sensors", "check the pull up resistor position for RS485 communication interface 112 and/or "check the communication status on the testing apparatus 100" that is related to indication of a functioning status of the one or more energy devices 110 on the testing apparatus 100 and vice versa. Assuming, there exists no communication error, however, the temperature values are not measured to be within the predefined set of tolerance values of the one or more temperature sensors 110c. In such a case, the recommendation module 222 generates diagnostic steps such as "check the temperature sensor, "check the place of installation of the temperature sensor and/or "replace the temperature sensor". Upon identifying the out-of-bound of current value of the one or more energy meters 110d from the predefined set of tolerance values, the recommendation module 222 generates one or more measures. The one or more measures like "check the wire connection of the energy meter with respect to Red, Yellow and Blue (R,Y,B) electric phases" and/or "check the high current scenario in the corresponding site". In an embodiment, the recommendation module 222 also recommends to rectify the one or more energy devices 110 upon detecting the unequal of the aggregated value with the predefined tolerance value. The recommendation module 222 also recommends which of the one or more energy devices 110 must be connected to which of the one or more power switches. Additionally, the recommendation module 222 is configured to detect and recommend root cause for the error in the performance of the one or more energy devices 100.

The other modules 224 processes all such operations required to monitor the performance of the one or more energy devices 110 on-site.

Figure 3:
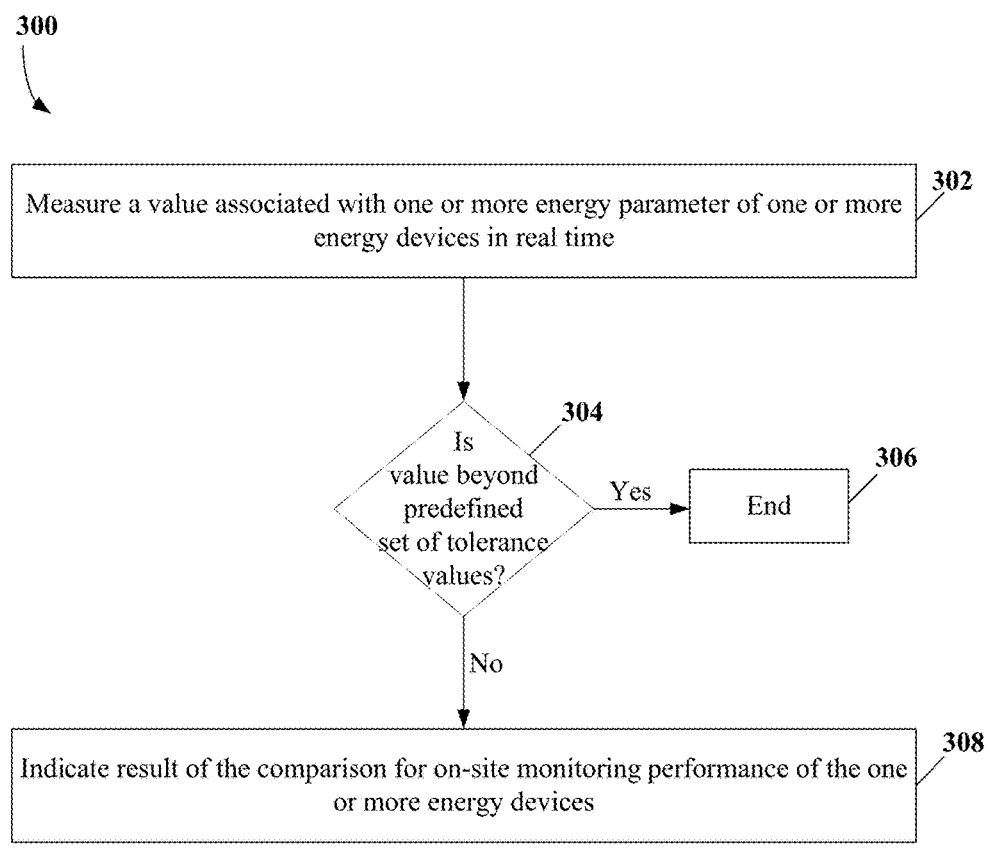
FIG. 3 shows a flowchart illustrating a method for on-site monitoring of performance of one or more energy devices in accordance with some embodiments of the present disclosure.

FIG. 3 shows a flowchart illustrating a method 300 for on-site monitoring of performance of the one or more energy devices 110 in accordance with some embodiments of the present disclosure.

As illustrated in FIG. 3, the method comprises one or more blocks for storing a pattern for on-site monitoring of the performance of the one or more energy devices 110. The method may be described in the general context of computer executable instructions. Generally, computer executable instructions can include routines, programs, objects, components, data structures, procedures, modules, and functions, which perform particular functions or implement particular abstract data types.

The order in which the method is described is not intended to be construed as a limitation, and any number of the described method blocks can be combined in any order to implement the method. Additionally, individual blocks may be deleted from the methods without departing from the scope of the subject matter described herein. Furthermore, the method can be implemented in any suitable hardware, software, firmware, or combination thereof.

At block 302, the value associated with the one or more energy parameters of the one or more energy devices 110 is measured in real time by the testing apparatus 100.

At block 304, the measured value of the one or more energy devices 100 is compared with the predefined set of tolerance values corresponding to the one or more energy parameters of the one or more energy devices 110. If the measured value of the one or more energy devices 110 is matching the predefined set of tolerance values, then the process goes to block 306 via "Yes" where the process is ended. If the measured value of the one or more energy devices 110 is going beyond and/or does not match the predefined set of tolerance values, then the process goes to block 308 via "No".

At block 308, the result of the comparison i.e. out-of-bound state is indicated on the display unit 108 and/or the display interface 114 for on-site monitoring performance of the one or more energy devices 110.

In an embodiment, the method 300 further performs aggregating the one or more values associated with the one or more energy parameters of the one or more energy devices 110 in real time. Then, the aggregated one or more values is compared with the predefined tolerance value corresponding to the one or more energy parameters of the one or more energy devices 110 for determining error in performance of the one or more energy devices 110.

In an embodiment, the method 300 further performs detecting connection of the one or more energy devices 110 to the one or more power switches based on at least one of the result of the comparison and the error in performance of the one or more energy devices 110. Then, upon detecting the error in the connection, the connection between the one or more energy devices 110 is swapped to the corresponding one or more power switches. In an embodiment, the alert in relation to the result of the comparison, the error in the performance of the one or more energy devices 110 and the error in the connection is generated on the display unit 108 and/or the display interface 114. In an embodiment, the recommendation is generated for rectifying the performance of the one or more energy devices 110 for on-site monitoring of the one or more energy devices 110. Additionally, the recommendation is generated to rectify the root cause for the error in the performance of the one or more energy devices 110.

Handheld Device

Figure 4:
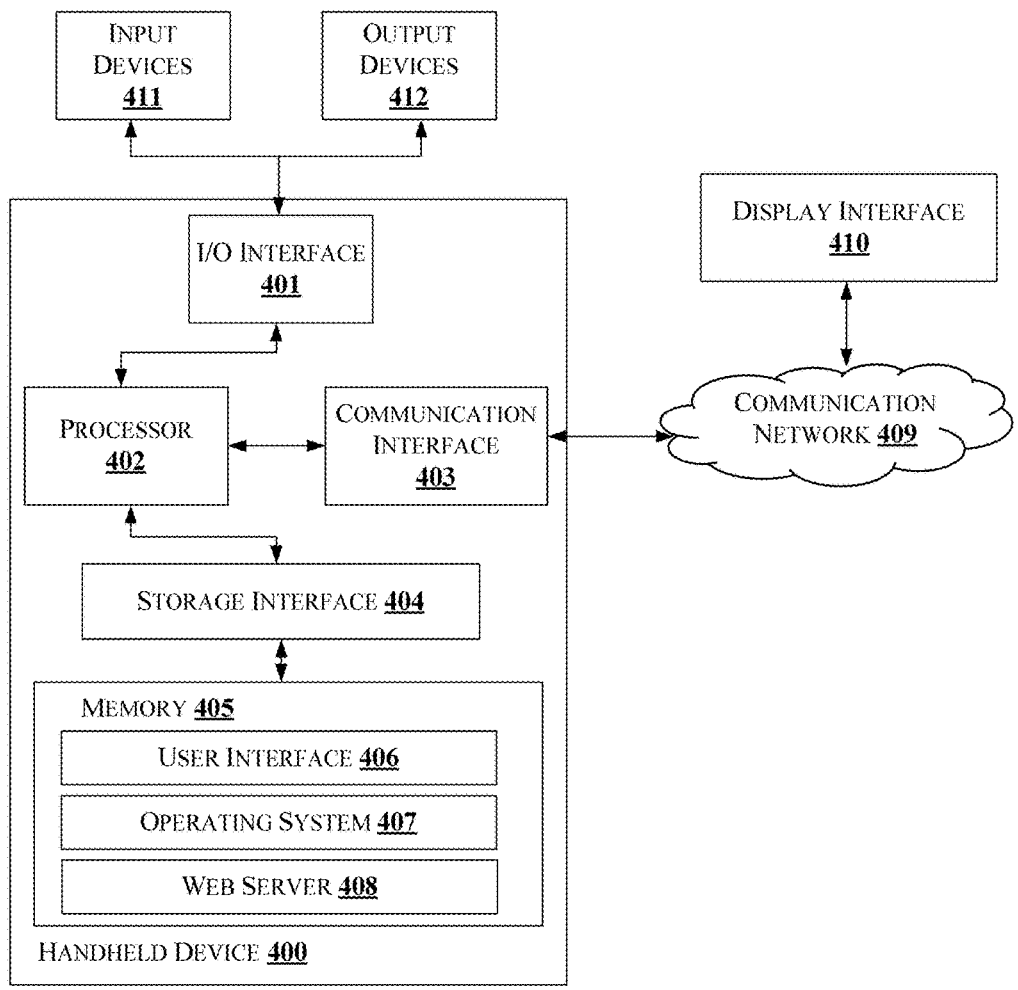
FIG. 4 illustrates a block diagram of an exemplary hand-held device for implementing embodiments consistent with the present disclosure.

FIG. 4 illustrates a block diagram of an exemplary handheld device 400 for implementing embodiments consistent with the present disclosure. In an embodiment, the handheld device 400 is used to implement the testing apparatus 100. The handheld device 400 performs on-site monitoring of performance of the one or more energy devices 110. The handheld device 400 may comprise a central processing unit ("CPU" or "processor") 402. The processor 402 may comprise at least one data processor for executing program components for executing user- or apparatus-generated energy parameters. A user may include a person, a person using a device such as those included in this disclosure, or such a device itself. The processor 402 may include specialized processing units such as integrated system (bus) controllers, memory management control units, floating point units, graphics processing units, digital signal processing units, etc.

The processor 402 may be disposed in communication with one or more input/output (I/O) devices (411 and 412) via I/O interface 401. The I/O interface 401 may employ communication protocols/methods such as, without limitation, audio, analog, digital, monoaural, RCA, stereo, IEEE-1394, serial bus, universal serial bus (USB), infrared, PS/2, BNC, coaxial, component, composite, digital visual interface (DVI), high-definition multimedia interface (HDMI), RF antennas, S-Video, VGA, IEEE 802.n/b/g/n/x, Bluetooth, cellular (e.g., code-division multiple access (CDMA), high-speed packet access (HSPA+), global system for mobile communications (GSM), long-term evolution (LTE), WiMax, or the like), etc.

Using the I/O interface 401, the handheld device 400 may communicate with one or more I/O devices (411 and 412). For example, the input device 411 may be an antenna, keyboard, mouse, joystick, (infrared) remote control, camera, card reader, fax machine, dongle, biometric reader, microphone, touch screen, touchpad, trackball, stylus, scanner, storage device, transceiver, video device/source, etc. The output device 412 may be a printer, fax machine, video display (e.g., cathode ray tube (CRT), liquid crystal display (LCD), light-emitting diode (LED), plasma, Plasma display panel (PDP), Organic light-emitting diode display (OLED) or the like), audio speaker, etc.

In some embodiments, the processor 402 may be disposed in communication with a memory 405 (e.g., RAM, ROM, etc. not shown in FIG. 4) via a storage interface 404. The storage interface 404 may connect to memory 405 including, without limitation, memory drives, removable disc drives, etc., employing connection protocols such as serial advanced technology attachment (SATA), Integrated Drive Electronics (IDE), IEEE-1394, Universal Serial Bus (USB), fiber channel, Small Computer Systems Interface (SCSI), etc. The memory drives may further include a drum, magnetic disc drive, magneto-optical drive, optical drive, Redundant Array of Independent Discs (RAID), solid-state memory devices, solid-state drives, etc.

The memory 405 may store a collection of program or database components, including, without limitation, user interface application 406, an operating system 407, web server 408 etc. In some embodiments, handheld device 400 may store user/application data, such as the data, variables, records, etc. as described in this disclosure. Such databases may be implemented as fault-tolerant, relational, scalable, secure databases such as Oracle or Sybase.

The operating system 407 may facilitate resource management and operation of the handheld device 400. Examples of operating systems include, without limitation, Apple Macintosh OS X, Unix, Unix-like system distributions (e.g., Berkeley Software Distribution (BSD), FreeBSD, NetBSD, OpenBSD, etc.), Linux distributions (e.g., Red Hat, Ubuntu, Kubuntu, etc.), IBM OS/2, Microsoft Windows (XP, Vista/7/8, etc.), Apple iOS, Google Android, Blackberry OS, or the like. User interface 606 may facilitate display, execution, interaction, manipulation, or operation of program components through textual or graphical facilities. For example, user interfaces may provide computer interaction interface elements on a display system operatively connected to the handheld device 400, such as cursors, icons, check boxes, menus, scrollers, windows, widgets, etc. Graphical 3 (GUIs) may be employed, including, without limitation, Apple Macintosh operating systems' Aqua, IBM OS/2, Microsoft Windows (e.g., Aero, Metro, etc.), Unix X-Windows, web interface libraries (e.g., ActiveX, Java, Javascript, AJAX, HTML, Adobe Flash, etc.), or the like.

In some embodiments, the handheld device 400 may implement a web browser 408 stored program component. The web browser may be a hypertext viewing application, such as Microsoft Internet Explorer, Google Chrome, Mozilla Firefox, Apple Safari, etc. Secure web browsing may be provided using Secure Hypertext Transport Protocol (HTTPS), Secure Sockets Layer (SSL), Transport Layer Security (TLS), etc. Web browsers may utilize facilities such as AJAX, DHTML, Adobe Flash, JavaScript, Java, Application Programming Interfaces (APIs), etc. In some embodiments, the handheld device 400 may implement a mail server stored program component. The mail server may be an Internet mail server such as Microsoft Exchange, or the like. The mail server may utilize facilities such as ASP, ActiveX, ANSI C++/C#, Microsoft .NET, CGI scripts, Java, JavaScript, PERL, PHP, Python, WebObjects, etc. The mail server may utilize communication protocols such as Internet Message Access Protocol (IMAP), Messaging Application Programming Interface (MAPI), Microsoft Exchange, Post Office Protocol (POP), Simple Mail Transfer Protocol (SMTP), or the like. In some embodiments, the handheld device 400 may implement a mail client stored program component. The mail client may be a mail viewing application, such as Apple Mail, Microsoft Entourage, Microsoft Outlook, Mozilla Thunderbird, etc.

In one implementation, the handheld device 400 is configured to communicate with the display interface 410 over a communication network 409 through a communication interface 403. The communication network 410 includes, but is not limited to, a direct interconnection, an e-commerce network, a peer to peer (P2P) network, local area network (LAN), wide area network (WAN), wireless network (e.g., using Wireless Application Protocol), the Internet, Wi-Fi and such. The first network and the second network may either be a dedicated network or a shared network, which represents an association of the different types of networks that use a variety of protocols, for example, Hypertext Transfer Protocol (HTTP), Transmission Control Protocol/Internet Protocol (TCP/IP), Wireless Application Protocol (WAP), etc., to communicate with each other. Further, the first network and the second network may include a variety of network devices, including routers, bridges, servers, computing devices, storage devices, etc. The network interface 1003 may employ connection protocols include, but not limited to, direct connect, Ethernet (e.g., twisted pair 10/100/1000 Base T), transmission control protocol/internet protocol (TCP/IP), token ring, IEEE 802.11a/b/g/n/x, etc.

Furthermore, one or more computer-readable storage media may be utilized in implementing embodiments consistent with the present disclosure. A computer-readable storage medium refers to any type of physical memory on which information or data readable by a processor may be stored. Thus, a computer-readable storage medium may store instructions for execution by one or more processors, including instructions for causing the processor(s) to perform steps or stages consistent with the embodiments described herein. The term "computer-readable medium" should be understood to include tangible items and exclude carrier waves and transient signals, i.e., be non-transitory. Examples include Random Access Memory (RAM), Read-Only Memory (ROM), volatile memory, nonvolatile memory, hard drives, CD ROMs, DVDs, flash drives, disks, and any other known physical storage media.

Advantages of the embodiment of the present disclosure are illustrated herein.

Embodiments of the present disclosure enable minimization in power consumption by the one or more energy devices 110.

Embodiments of the present disclosure provides recommendation and alert in the same device i.e. testing apparatus 100 which validates the performance of the one or more energy devices 100.

Embodiments of the present disclosure provide rectification process in rectifying the performance of the one or more energy devices 110. Also, the rectification in mapping the connection between the one or more energy devices 110 with the power switches is provided.

The described operations may be implemented as a method, system or article of manufacture using standard programming and/or engineering techniques to produce software, firmware, hardware, or any combination thereof. The described operations may be implemented as code maintained in a "non-transitory computer readable medium", where a processor may read and execute the code from the computer readable medium. The processor is at least one of a microprocessor and a processor capable of processing and executing the queries. A non-transitory computer readable medium may comprise media such as magnetic storage medium (e.g., hard disk drives, floppy disks, tape, etc.), optical storage (CD-ROMs, DVDs, optical disks, etc.), volatile and non-volatile memory devices (e.g., EEPROMs, ROMs, PROMs, RAMs, DRAMs, SRAMs, Flash Memory, firmware, programmable logic, etc.), etc. Further, non-transitory computer-readable media comprise all computer-readable media except for a transitory. The code implementing the described operations may further be implemented in hardware logic (e.g., an integrated circuit chip, Programmable Gate Array (PGA), Application Specific Integrated Circuit (ASIC), etc.).

Still further, the code implementing the described operations may be implemented in "transmission signals", where transmission signals may propagate through space or through a transmission media, such as an optical fiber, copper wire, etc. The transmission signals in which the code or logic is encoded may further comprise a wireless signal, satellite transmission, radio waves, infrared signals, Bluetooth, etc. The transmission signals in which the code or logic is encoded is capable of being transmitted by a transmitting station and received by a receiving station, where the code or logic encoded in the transmission signal may be decoded and stored in hardware or a non-transitory computer readable medium at the receiving and transmitting stations or devices. An "article of manufacture" comprises non-transitory computer readable medium, hardware logic, and/or transmission signals in which code may be implemented. A device in which the code implementing the described embodiments of operations is encoded may comprise a computer readable medium or hardware logic. Of course, those skilled in the art will recognize that many modifications may be made to this configuration without departing from the scope of the invention, and that the article of manufacture may comprise suitable information bearing medium known in the art.

The terms "an embodiment", "embodiment", "embodiments", "the embodiment", "the embodiments", "one or more embodiments", "some embodiments", and "one embodiment" mean "one or more (but not all) embodiments of the invention(s)" unless expressly specified otherwise.

The terms "including", "comprising", "having" and variations thereof mean "including but not limited to", unless expressly specified otherwise.

The enumerated listing of items does not imply that any or all of the items are mutually exclusive, unless expressly specified otherwise.

The terms "a", "an" and "the" mean "one or more", unless expressly specified otherwise.

A description of an embodiment with several components in communication with each other does not imply that all such components are required. On the contrary a variety of optional components are described to illustrate the wide variety of possible embodiments of the invention.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article or a different number of devices/articles may be used instead of the shown number of devices or programs. The functionality and/or the features of a device may be alternatively embodied by one or more other devices which are not explicitly described as having such functionality/features. Thus, other embodiments of the invention need not include the device itself.

The illustrated operations of FIG. 3 show certain events occurring in a certain order. In alternative embodiments, certain operations may be performed in a different order, modified or removed. Moreover, steps may be added to the above described logic and still conform to the described embodiments. Further, operations described herein may occur sequentially or certain operations may be processed in parallel. Yet further, operations may be performed by a single processing unit or by distributed processing units.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based here on. Accordingly, the disclosure of the embodiments of the invention is intended to be illustrative, but not limiting, of the scope of the invention, which is set forth in the following claims.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method for on-site monitoring of performance of energy devices, the method comprising:
    measuring, by a testing apparatus computing device, a value associated with one or more energy parameters of one or more energy devices in real time;
    comparing, by the testing apparatus computing device, the measured value of the one or more energy devices with a predefined set of tolerance values corresponding to the one or more energy parameters of the one or more energy devices; and
    indicating, by the testing apparatus computing device, a result of the comparison on a display unit associated with the testing apparatus for on-site monitoring performance of the one or more energy devices;
    aggregating, by the testing apparatus computing device, one or more values associated with the one or more energy parameters of the one or more energy devices in real time; and
    comparing, by the testing apparatus computing device, the aggregated one or more values with a predefined tolerance value corresponding to the one or more energy parameters of the one or more energy devices for determining error in performance of the one or more energy devices;
    detecting, by the testing apparatus computing device, an electrical connection of the one or more energy devices to one or more power switches based on at least one of the result of the comparison and the error in performance of the one or more energy devices; and
    swapping, by the testing apparatus computing device, the electrical connection between the one or more energy devices to the corresponding one or more power switches.

2. The method as claimed in claim 1 further comprising: providing, by the testing apparatus computing device, an alert based on the result of the comparison.

3. The method as claimed in claim 1 further comprising: providing, by the testing apparatus computing device, a recommendation for rectifying the one or more energy devices for on-site monitoring of the one or more energy devices.

4. A testing apparatus computing device for on-site monitoring of performance of energy devices comprising a processor and a memory coupled to the processor which is configured to be capable of executing programmed instructions comprising and stored in the memory to:
    measure a value associated with one or more energy parameters of one or more energy devices in real time;
    compare the measured value of the one or more energy devices with a predefined set of tolerance values corresponding to the one or more energy parameters of the one or more energy devices;
    indicate a result of the comparison on a display unit associated with the testing apparatus for on-site monitoring performance of the one or more energy devices;
    aggregate one or more values associated with the one or more energy parameters of the one or more energy devices in real time; and
    compare the aggregated one or more values with a predefined tolerance value corresponding to the one or more energy parameters of the one or more energy devices for determining error in performance of the one or more energy devices;
    detect an electrical connection of the one or more energy devices to one or more power switches based on at least one of the result of the comparison and the error in performance of the one or more energy devices; and
    swap the electrical connection between the one or more energy devices to the corresponding one or more power switches.

5. The device as claimed in claim 4 further comprising one or more communication interfaces to connect to each of the one or more energy devices.

6. The device as claimed in claim 4, wherein the processor coupled to the memory is further configured to be capable of executing at least one additional programmed instruction comprising and stored in the memory to:
    provide an alert based on the result of the comparison.

7. The device as claimed in claim 4, wherein the processor coupled to the memory is further configured to be capable of executing at least one additional programmed instruction comprising and stored in the memory to:
    provide a recommendation for rectifying the one or more energy devices for on-site monitoring of the one or more energy devices.

8. The device as claimed in claim 4, wherein the one or more energy devices comprise one or more of sensors, meters, or electrical appliances.

9. A non-transitory computer readable medium having stored thereon instructions for on-site monitoring of performance of energy devices comprising executable code which when executed by a processor, causes the processor to perform steps comprising:
    measuring a value associated with one or more energy parameters of one or more energy devices in real time;
    comparing the measured value of the one or more energy devices with a predefined set of tolerance values corresponding to the one or more energy parameters of the one or more energy devices; and
    indicating a result of the comparison on a display unit associated with the testing apparatus for on-site monitoring performance of the one or more energy devices;

aggregating one or more values associated with the one or more energy parameters of the one or more energy devices in real time; and comparing the aggregated one or more values with a predefined tolerance value corresponding to the one or more energy parameters of the one or more energy devices for determining error in performance of the one or more energy devices;

detecting an electrical connection of the one or more energy devices to one or more power switches based on at least one of the result of the comparison and the error in performance of the one or more energy devices; and swapping the electrical connection between the one or more energy devices to the corresponding one or more power switches.

10. The medium as claimed in claim 9 further having stored thereon at least one additional instruction that when executed by the processor causes the processor to perform at least one additional step comprising:

providing an alert based on the result of the comparison.

11. The medium as claimed in claim 9 further having stored thereon at least one additional instruction that when executed by the processor causes the processor to perform at least one additional step comprising:

providing a recommendation for rectifying the one or more energy devices for on-site monitoring of the one or more energy devices.

\* \* \* \* \*